(12) United States Patent
Yoshiki et al.

(10) Patent No.: US 9,836,176 B1
(45) Date of Patent: Dec. 5, 2017

(54) OPTICALLY TRANSPARENT CONDUCTIVE MATERIAL

(71) Applicant: MITSUBISHI PAPER MILLS LIMITED, Sumida-ku, Tokyo (JP)

(72) Inventors: Takenobu Yoshiki, Sumida-ku (JP); Kazuhiko Sunada, Sumida-ku (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 0 days.

(21) Appl. No.: 15/533,416

(22) PCT Filed: Dec. 10, 2015

(86) PCT No.: PCT/JP2015/084712
§ 371 (c)(1),
(2) Date: Jun. 6, 2017

(87) PCT Pub. No.: WO2016/098683
PCT Pub. Date: Jun. 23, 2016

(30) Foreign Application Priority Data

Dec. 16, 2014 (JP) ................................. 2014-253551

(51) Int. Cl.
*G06F 3/044* (2006.01)
*H05K 1/02* (2006.01)

(52) U.S. Cl.
CPC ........... *G06F 3/044* (2013.01); *H05K 1/0274* (2013.01); *G06F 2203/04111* (2013.01);
(Continued)

(58) Field of Classification Search
CPC . G06F 2203/04112; G06F 2203/04103; G06F 3/047; G06F 2203/04111;
(Continued)

(56) References Cited

U.S. PATENT DOCUMENTS

2014/0111711 A1* 4/2014 Iwami ................. G06F 3/044
349/12
2014/0198269 A1 7/2014 Hwang et al.
(Continued)

FOREIGN PATENT DOCUMENTS

JP 2013-084639 5/2013
JP 2014-026510 2/2014
(Continued)

OTHER PUBLICATIONS

Mathematical Models of Territories—Introduction to Mathematical Engineering through Voronoi diagrams—(published by Kyoritsu Shuppan in Feb. 2009).

*Primary Examiner* — Duc Dinh
(74) *Attorney, Agent, or Firm* — Fitzpatrick Cella Harper and Scinto (57) ABSTRACT

Provided is an optically transparent conductive material which is suitable as an optically transparent electrode for capacitive touchscreens, the optically transparent conductive material not causing moire even when placed over a liquid crystal display, having a favorably low pattern conspicuousness (non-conspicuousness), and having a high reliability. The optically transparent conductive material has, on an optically transparent support, an optically transparent conductive layer having optically transparent sensor parts electrically connected to terminal parts and optically transparent dummy parts not electrically connected to terminal parts, and in this optically transparent conductive material, the sensor parts and the dummy parts are formed of a metal thin line pattern having a mesh shape, and in the plane of the optically transparent conductive layer, the contour shape of each of the sensor parts extends in a first direction, the dummy parts are arranged alternately with the sensor parts in a second direction perpendicular to the first direction, the sensor parts are arranged at a cycle of L in the second (Continued)

direction, at least part of the metal thin line pattern in the sensor parts has a cycle of 2L/N in the second direction (wherein N is any natural number), and the metal thin line pattern in the dummy parts has a cycle longer than 2L/N or does not have a cycle in the second direction.

4 Claims, 9 Drawing Sheets

(52) U.S. Cl.
CPC ............... *G06F 2203/04112* (2013.01); *H05K 2201/0108* (2013.01); *H05K 2201/0302* (2013.01); *H05K 2201/09218* (2013.01)

(58) Field of Classification Search
CPC ............. G06F 2203/04102; G06F 1/16; G06F 3/0418; G06F 17/5081

USPC .................................................. 345/173–175
See application file for complete search history.

(56) References Cited

U.S. PATENT DOCUMENTS

| 2014/0216785 | A1* | 8/2014 | Zhou | .................... H05K 1/0274 174/250 |
| 2014/0218642 | A1 | 8/2014 | Iwami | |
| 2014/0320448 | A1* | 10/2014 | Kim | ........................ G06F 3/044 345/174 |
| 2015/0378485 | A1 | 12/2015 | Nakamura | |

FOREIGN PATENT DOCUMENTS

| JP | 2014-529841 | 11/2014 |
| TW | 201314525 | 4/2013 |
| WO | 2014/136584 | 9/2014 |

* cited by examiner

OPTICALLY TRANSPARENT CONDUCTIVE MATERIAL

This application is a national phase of PCT Application No. PCT/JP2015/084712 filed Dec. 10, 2015, which in turn claims benefit of Japanese Patent Application No. 2014-253551 filed Dec. 16, 2014.

TECHNICAL FIELD

The present invention relates to an optically transparent conductive material mainly used for touchscreens and, in particular, to an optically transparent conductive material preferably used for optically transparent electrodes of projected capacitive touchscreens.

BACKGROUND ART

In electronic devices, such as personal digital assistants (PDAs), laptop computers, office automation equipment, medical equipment, and car navigation systems, touchscreens are widely used as their display screens that also serve as input means.

There are a variety of touchscreens that utilize different position detection technologies, such as optical, ultrasonic, surface capacitive, projected capacitive, and resistive technologies. A resistive touchscreen has a configuration in which an optically transparent conductive material and a glass plate with an optically transparent conductive layer are separated by spacers and face each other so as to function as a touchsensor formed of an optically transparent electrode. A current is applied to the optically transparent conductive material and the voltage of the glass plate with an optically transparent conductive layer is measured. In contrast, a capacitive touchscreen has a basic configuration in which a touchsensor formed of an optically transparent electrode is an optically transparent conductive material having an optically transparent conductive layer provided on a support and there are no movable parts. Capacitive touchscreens are used in various applications due to their high durability and high light transmittance. Further, touchscreens utilizing projected capacitive technology allow simultaneous multipoint detection, and therefore are widely used for smartphones, tablet PCs, etc.

Conventionally, as an optically transparent conductive material used for optically transparent electrodes of touchscreens, those having an optically transparent conductive layer made of an ITO (indium tin oxide) film formed on a support have been used. However, there has been a problem of low optical transparency due to high refractive index and high surface light reflectivity of ITO conductive films. Another problem is that ITO conductive films have low flexibility and thus are prone to crack when bent, resulting in increased electric resistance of the optically transparent conductive material.

A known optically transparent conductive material as an alternative to the one having an optically transparent conductive layer formed of an ITO conductive film is an optically transparent conductive material having, as an optically transparent conductive layer, a mesh pattern of metal thin lines on an optically transparent support, in which pattern, for example, the line width, pitch, pattern shape, etc. are appropriately adjusted. This technology provides an optically transparent conductive material which maintains a high light transmittance and which has a high conductivity. Regarding the shape of the mesh pattern of metal thin lines (hereinafter also written simply as metal thin line pattern), it is known that a repetition unit of any shape, for example, a triangle, such as an equilateral triangle, an isosceles triangle, and a right triangle; a quadrangle, such as a square, a rectangle, a rhombus, a parallelogram, and a trapezoid; an (equilateral) n-sided polygon, such as an (equilateral) hexagon, an (equilateral) octagon, an (equilateral) dodecagon, and an (equilateral) icosagon; a circle; an ellipse; and a star, and a combinational pattern of two or more thereof can be used.

As a method for producing the above-mentioned optically transparent conductive material having a mesh pattern of metal thin lines, a semi-additive method for forming a metal thin line pattern, the method comprising forming a thin catalyst layer on a support, forming a resist pattern on the catalyst layer, forming a laminated metal layer in an opening of the resist by plating, and finally removing the resist layer and the base metal protected by the resist layer, is suggested.

Also, in recent years, a method in which a silver halide diffusion transfer process is employed using a silver halide photosensitive material as a precursor to a conductive material has been proposed. In this method, a silver halide photosensitive material (a conductive material precursor) having, on a support, a physical development nuclei layer and a silver halide emulsion layer in this order is subjected to a reaction with a soluble silver halide forming agent and a reducing agent in an alkaline fluid to form a metal (silver) pattern. The patterning by the method can reproduce uniform line width. In addition, due to the highest conductivity of silver among all metals, a thinner line with a higher conductivity can be achieved as compared with other methods. An additional advantage is that a layer having a metal thin line pattern obtained by this method has a higher flexibility, i.e. a longer flexing life as compared with an ITO conductive layer.

When an optically transparent conductive material having, on an optically transparent support, such a metal thin line pattern as described above is placed over a liquid crystal display, the cycle of the metal thin line pattern and the cycle of the liquid crystal display element interfere with each other, causing a problem of moire. In recent years, liquid crystal displays of different resolutions have been used, which further complicates the above-mentioned problem.

As a solution to this problem, suggested is a method in which moire is suppressed by using, as the metal thin line pattern, a traditional random diagram described in, for example, Non Patent Literature 1. In Patent Literature 1 and 2, an electrode material for touchscreens in which a plurality of unit areas having a random metal thin line pattern are arranged is introduced.

CITATION LIST

Patent Literature

Patent Literature 1: JP 2014-26510 A
Patent Literature 2: JP 2013-84639 A

Non Patent Literature

Non Patent Literature 1: *Mathematical Models of Territories—Introduction to Mathematical Engineering through Voronoi diagrams*—(published by Kyoritsu Shuppan in February, 2009)

SUMMARY OF INVENTION

Technical Problem

Since the metal thin line pattern using a random diagram does not have any cyclic pattern shape formed by repetition of a simple unit graphic and therefore theoretically does not interfere with the cycle of the liquid crystal display element, moire does not occur. However, in the metal thin line pattern using a random diagram, a part where the distribution of the metal thin line pattern is sparse and a part where the distribution is dense randomly appear and are visibly recognized, causing a problem of so-called "grains".

In a method that has been introduced to address the problem, a plurality of unit graphics having a random pattern of metal thin lines and a low possibility of causing grains are arranged for producing a sensor part or a dummy part. Patent Literature 1 suggests an electrode material for touchscreens in which a plurality of quadrangular or rhombic unit areas (unit graphics) having a random metal thin line pattern are arranged in contact with each other at the corners thereof to form sensor parts extending in a first direction. Patent Literature 2 suggests a method for designing a unit graphic formed of a random metal thin line pattern. When the unit graphic (unit area) designed according to this method is repeatedly arranged, the metal thin line patterns connect with each other on the boundaries between adjacent unit areas. However, the method in which a plurality of unit graphics having a random pattern of metal thin lines are arranged to produce the sensor part or the dummy part causes a problem of mild grains appearing in a cyclic manner due to the repeat of the unit graphic. In particular in dark conditions, when the optically transparent conductive material formed of a metal thin line pattern is observed using a reflected light, the problem is significant, and therefore means for improvement have been required.

Generally, in an optically transparent electrode of a capacitive touchscreen, a great number of sensor parts extending in a specific direction are each electrically connected with a terminal part via a wire part, and between the plurality of sensor parts, for the purpose of lowering the conspicuousness of the sensor parts, dummy parts formed of a metal thin line pattern (parts formed of a metal thin line pattern not electrically connected with a terminal part) are provided. However, in certain kinds of touchscreens, the width of each sensor part is designed so narrow as to be almost equal to the interval between the lines of the mesh pattern of metal thin lines. In such a case, use of a metal thin line pattern of which the line width is thin causes a problem of reliability, e.g., variation of resistance values and occurrence of line breaks in the production of the optically transparent electrode or in the storage of the optically transparent electrode in high-temperature and high-humidity conditions. When the above-mentioned random metal thin line pattern is used, this problem is significant.

Therefore, an object of the present invention is to provide an optically transparent conductive material which is suitable as an optically transparent electrode for capacitive touchscreens, the optically transparent conductive material not causing moire even when placed over a liquid crystal display, having a favorably low pattern conspicuousness (non-conspicuousness), and having a high reliability.

Solution to Problem

The above objective is basically achieved by an optically transparent conductive material having, on an optically transparent support, an optically transparent conductive layer having optically transparent sensor parts electrically connected to terminal parts and optically transparent dummy parts not electrically connected to terminal parts, wherein the sensor parts and the dummy parts are formed of a metal thin line pattern having a mesh shape, and in the plane of the optically transparent conductive layer, the contour shape of each of the sensor parts extends in a first direction, the dummy parts are arranged alternately with the sensor parts in a second direction perpendicular to the first direction, the sensor parts are arranged at a cycle of L in the second direction, at least part of the metal thin line pattern in the sensor parts has a cycle of 2L/N in the second direction (wherein N is any natural number), and the metal thin line pattern in the dummy parts has a cycle longer than 2L/N or does not have a cycle in the second direction.

The metal thin line pattern in the sensor part and the dummy part is preferably a Voronoi pattern. In addition, preferred are that N is 4 or less and that the metal thin line pattern in the dummy part has a cycle of P×L (wherein P is a natural number of 4 to 20) in the second direction.

Advantageous Effects of Invention

The present invention provides an optically transparent conductive material which is suitable as an optically transparent electrode for capacitive touchscreens, the optically transparent conductive material not causing moire even when placed over a liquid crystal display, having a favorably low pattern conspicuousness (non-conspicuousness), and having a high reliability.

DESCRIPTION OF EMBODIMENTS

Hereinafter, the present invention will be described in detail with reference to drawings, but it is needless to say that the present invention is not limited to the embodiments described below and various alterations and modifications may be made without departing from the technical scope of the invention.

Figure 1:
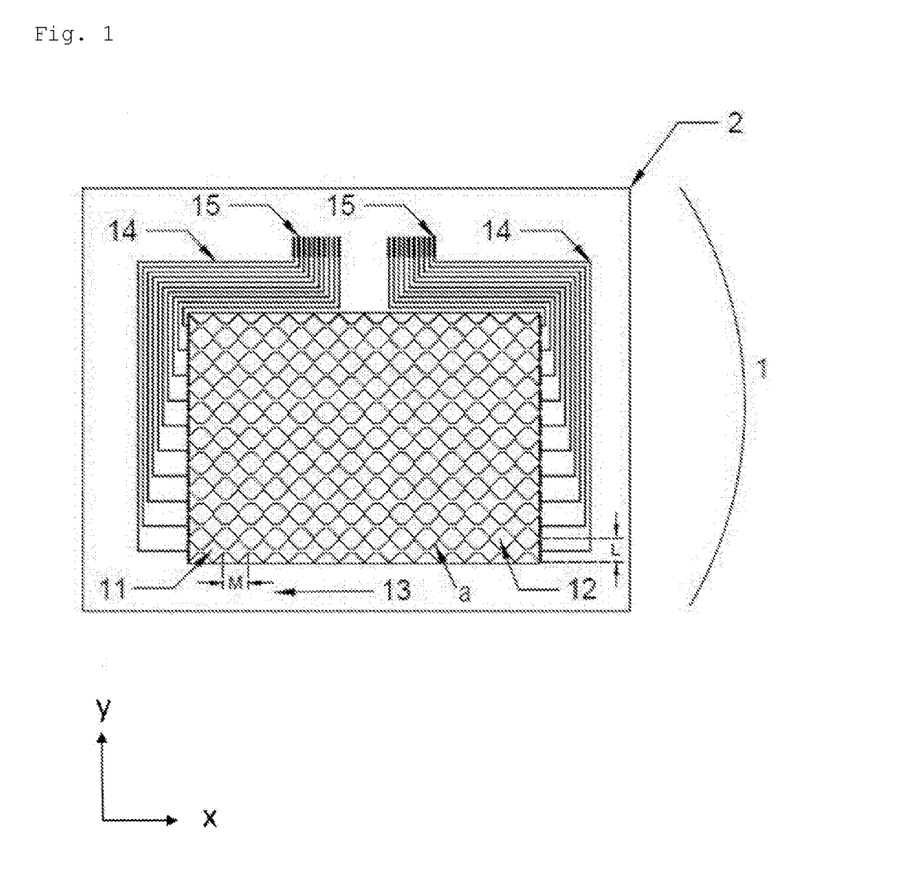
FIG. 1 is a schematic view showing an example of the optically transparent conductive material of the present invention.

FIG. 1 is a schematic view showing an example of the optically transparent conductive material of the present invention. In FIG. 1, an optically transparent conductive material 1 has, on at least one surface of an optically transparent support 2, a sensor part 11 and a dummy part 12 formed of a metal thin line pattern having a mesh shape, a peripheral wire part 14, a terminal part 15, and a non-image part 13 not having any pattern. The regions of the sensor part 11 and the dummy part 12, which are formed of a metal thin line pattern having a mesh shape, are conveniently shown by a boundary line a (non-existent line). The boundary line a is, as described later, also a line connecting line breaks provided on the metal thin line pattern having a mesh shape for forming a plurality of sensor parts.

The sensor part 11 is electrically connected, via a peripheral wire part 14, to a terminal part 15. By electrically connecting the terminal part 15 to the outside, the changes in capacitance detected by the sensor part 11 can be captured. Meanwhile, metal thin line patterns not electrically connected to the terminal part 15 all serve as dummy parts 12 in the present invention. In the present invention, the peripheral wiring part 14 and the terminal part 15 need not particularly have optical transparency, and therefore may either be a solid pattern (a filled pattern without optical transparency) or be such a metal thin line pattern of a mesh shape having optical transparency as the sensor part 11 and the dummy part 12.

In FIG. 1, the sensor parts 11 of the optically transparent conductive material 1 are column electrodes of each of which the contour shape extends in a first direction (x direction in the figure) in the plane of the optically transparent conductive layer. Between the column electrodes of the sensor parts 11, disposed is a dummy part 12 being formed of a mesh pattern of metal thin lines and not having electrical connection with the sensor parts 11 due to line breaks of the metal thin lines provided at least near intersections with the boundary line a. In the plane of the optically transparent conductive layer, a plurality of columns of the sensor parts 11 and the dummy parts 12 are alternately arranged in the second direction (y direction) perpendicular to the first direction. The columns of the sensor parts 11 are arranged at a certain cycle L in the y direction as in FIG. 1. The cycle L of the sensor parts 11 may be set at any length in such a range that the resolution appropriate for a touch sensor can be maintained. The width of the shape of the sensor part 11 may be constant, but it is also possible that the shape has a pattern cycle in the x direction as shown in FIG. 1. FIG. 1 shows an example in which the sensor part 11 is narrowed at a cycle of M (an example of a diamond pattern). The width of the sensor part 11 (the width of the unnarrowed portions in the diamond pattern) may also be set at any value in such a range that the resolution appropriate for a touch sensor can be maintained, and accordingly the shape and the width of the dummy part 12 may also be freely set.

In the present invention, the sensor part 11 and the dummy part 12 are formed of a mesh pattern of metal thin lines. Regarding the mesh shape of the metal thin line pattern, various kinds of repetition patterns can be used. In view of preventing moire, however, preferred are known random patterns, for example, a Voronoi pattern, Penrose tiling, Delaunay pattern, etc. Among them, preferred is a Voronoi pattern, which is less likely to cause an interference pattern, such as moire, or a modified pattern thereof. These patterns may include, as a part thereof, a regular pattern formed of repetition of a shape, such as a triangle, a quadrangle, a pentagon, and a rhombus.

Figure 2:
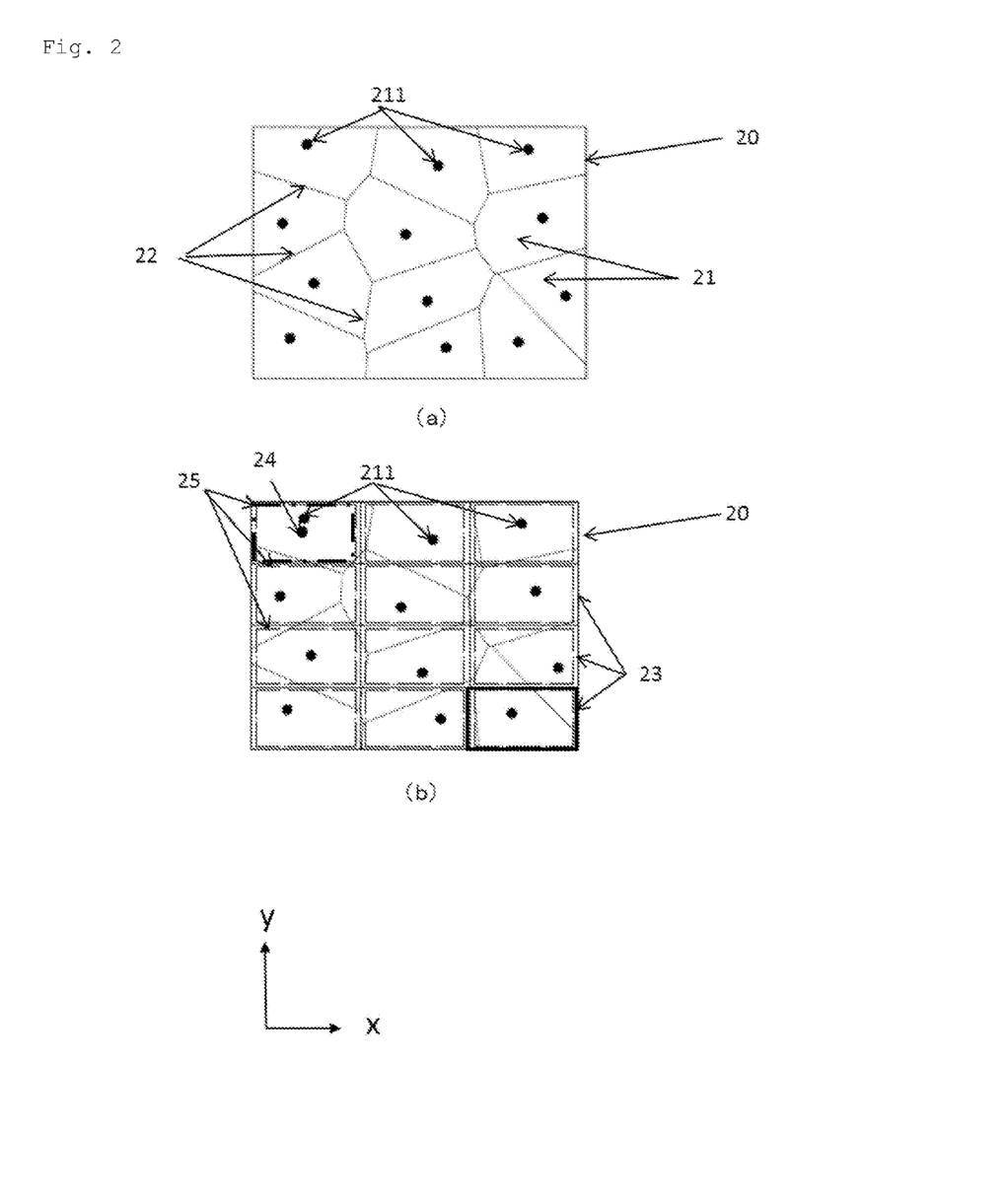
FIGS. 2(a) and 2(b) are views for illustrating Voronoi edges used in the present invention.

The Voronoi pattern preferably used in the present invention will be described. A Voronoi pattern is a diagram as a collection of Voronoi edges. The Voronoi edges are publicly known as a diagram applied in various fields including the field of information processing, and FIG. 2a and FIG. 2b are used to illustrate the diagram. FIG. 2a and FIG. 2b are for illustrating Voronoi edges in the present invention. In FIG. 2a, generators 211 are disposed on a plane 20. The plane 20 is divided by boundary lines 22 in such a manner that a region 21 closest to a generator 211 is separated from other regions 21 each closest to a different generator 211. The boundary lines 22 each between two different regions 21 are called Voronoi edges. A Voronoi edge is a part of the perpendicular bisector of the line segment connecting a generator to an adjacent generator.

Methods for disposing generators will be described referring to FIG. 2b. Methods for disposing generators include a method in which an arbitrary number of generators 211 are randomly disposed on a plane 20 and a method in which a plane 20 is divided into regions and an arbitrary number of generators 211 are randomly disposed in the regions. In the present invention, the latter method is preferred. In the present invention, methods for dividing the plane 20 include a method in which the plane 20 is tiled using a plurality of polygons of a single kind or of two or more kinds (hereinafter, referred to as original polygons) and then the plane 20 is divided by the original polygons or a method in which the original polygons are enlarged or reduced and then the plane 20 is divided by the enlarged or reduced polygons. In the present invention, both methods are preferably used. It is preferred that, after dividing the plane 20 as described above, an arbitrary number of generators are randomly disposed in the original polygons or the enlarged or reduced polygons. In FIG. 2b, the plane 20 is tiled using original polygons 23, which are rectangles, subsequently the original polygons are reduced so that the length of each side becomes 90% to produce reduced polygons 25, and then generators 211 are randomly disposed in the reduced polygons 25. In the present invention, in order to prevent the phenomenon of "grains" (a phenomenon in which high-density portions and low-density portions appear in the pattern of a random diagram), preferred is tiling using original polygons 23 of a single shape as shown in FIG. 2b.

As the shape of the original polygon, preferred are a quadrangle, such as a square, a rectangle, and a rhombus; a triangle; and a hexagon. From the viewpoint of preventing the phenomenon of grains, preferred among them is a quadrangle, and the length of one side of the original polygon is preferably 100 to 2000 μm, and more preferably 150 to 800 μm. As a method for producing enlarged or reduced polygons of original polygons, preferred in the present invention is that all the original polygons 23 tiling a plane are enlarged or reduced at the same ratio in the same direction. In addition, it is preferred that the position of the enlarged or reduced polygon is the same as the position of the original polygon. In the present invention, "the position of the enlarged or reduced polygon is the same as the position of the original polygon" means that the position of the gravity center of the enlarged or reduced polygon is the same as the position of the gravity center of the original polygon. In FIG. 2b, a reduced polygon 25 is obtained by reducing an original polygon 23 with respect to the gravity center 24 of the original polygon so that the length of each side becomes 90%. In the present invention, the enlargement or reduction ratio of the enlarged or reduced polygon to the original polygon (the enlargement or reduction ratio of each side of the enlarged or reduced polygon to corresponding side of the original polygon) is preferably 10 to 300%, and more preferably 60 to 200%. Also, the enlargement or reduction ratio in the x direction and that in the y direction may be the same or different. In the present invention, the number of generators 211 disposed in an enlarged or reduced polygon is preferably 1 to 3, and more preferably 1. In the present invention, the Voronoi edge is most preferably a straight line, but a curved line, a wavy line, a zigzag line, etc. may also be used.

Figure 3:
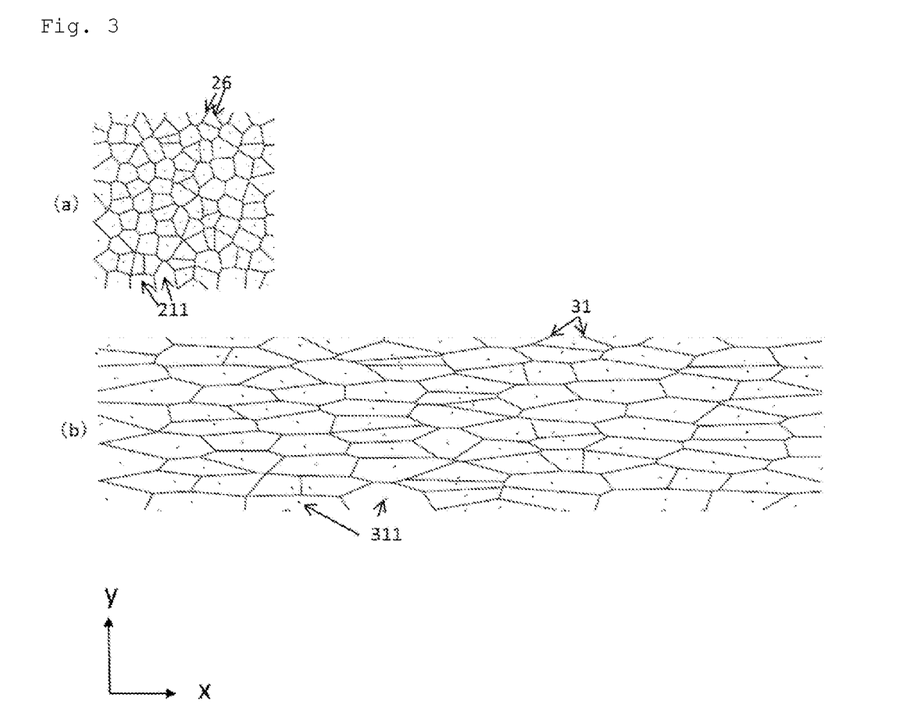
FIGS. 3(a) and 3(b) are for illustrating a modified pattern of a Voronoi pattern used in the present invention.

In the present invention, a pattern obtained by enlarging or reducing, in an arbitrary direction, a Voronoi pattern obtained by the method as described above is a modified Voronoi pattern that is preferable in the present invention. The method for enlarging or reducing a Voronoi diagram in an arbitrary direction will be described below. FIG. 3a and FIG. 3b are for illustrating a modified pattern of a Voronoi pattern used in the present invention. FIG. 3a illustrates the Voronoi pattern before the enlargement or reduction. FIG. 3b shows a modified pattern obtained by enlarging the pattern having Voronoi edges 26 shown in FIG. 3a four times in the x direction, where scaling in the y direction is not performed. The Voronoi edges 26 in FIG. 3a correspond to the enlarged sides 31 in FIG. 3b, and the generators 211 in FIG. 3a correspond to the generators 311 in FIG. 3b. The diagram of FIG. 3b, which does not retain the above-described relation between generators and Voronoi edges, is not a Voronoi diagram. In each of the figures including FIG. 3a and FIG. 3b, generators are shown for convenience, but such generators do not exist in the actual metal pattern of the sensor parts and/or the dummy parts.

Figure 4:
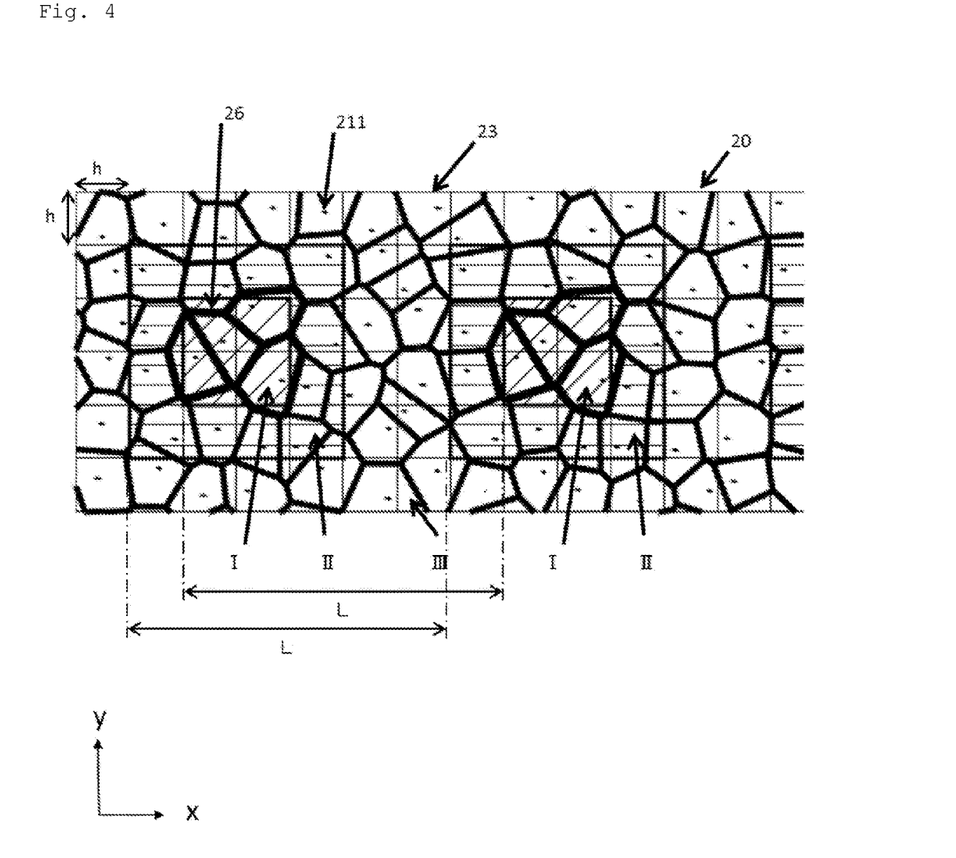
FIG. 4 is a schematic view showing an example of a method for producing a cycle in the metal thin line pattern in the sensor part.

Next, an example of a method for producing a cycle in the metal thin line pattern in the sensor part will be described referring to FIG. 4, using the above-described Voronoi pattern generated from generators disposed in enlarged or reduced polygons. FIG. 4 is a schematic view showing an example of a method for producing a cycle in the metal thin line pattern in the sensor part. In FIG. 4, generators provided in original polygons belonging to the area I shaded with oblique lines have a cycle (that is, repeatedly appear at a certain cycle in the plane 20), and generators provided in original polygons belonging to the area III do not have a cycle (that is, do not repeatedly appear at a certain cycle in the plane 20). Generators provided in original polygons belonging to the area II shaded with horizontal lines have the same cycle as that of generators in the area I for the purpose of continuously connecting the Voronoi pattern generated from generators provided in original polygons belonging to the area I and the Voronoi pattern generated from generators provided in original polygons belonging to the area III without any breaks.

In FIG. 4, the plane 20 is tiled using original polygons 23, which are squares of a single kind (of which the length of each side is h), arranged in 14 columns in the x direction and in 6 rows in the y direction. Each original polygon 23 has one generator 211 randomly disposed therein. In FIG. 4, generators in the area I shaded with oblique lines appear at a cycle of L equivalent to 6h in the x direction. In contrast, generators disposed in the area III do not have a cycle. Generators in the area II shaded with horizontal lines, as the generators in the area I, appear at a cycle of L equivalent to 6h in the x direction. When Voronoi edges are generated from the generators 211 disposed in this manner, Voronoi edges 26 generated from generators 211 disposed in original polygons belonging to the area I (shown in bold lines for the purpose of illustration) appear at a cycle of L in the x direction. Voronoi edges 26 generated from generators disposed in original polygons belonging to the area III do not have a cycle. Regarding Voronoi edges 26 generated from generators disposed in original polygons belonging to the area II, some have a cycle and others do not. Description based on the function of each area is as follows. The area I is a Voronoi pattern, which is a random diagram per se, but has a cycle L in the x direction; the area III is a Voronoi pattern which does not have a cycle; and the area II is a Voronoi pattern which may or may not have a cycle, and is provided for the purpose of connecting the area I having a cycle and the area III not having a cycle, without any breaks in Voronoi edges.

The area II is provided between the area I and the area III. The width of the area II, i.e., the number of original polygons present between the area I and the area III is determined by dividing the enlargement or reduction ratio of the enlarged or reduced polygon to the original polygon (the enlargement or reduction ratio of each side of the enlarged or reduced polygon to corresponding side of the original polygon:enlargement or reduction percentage) by 100% and rounding up to an integer. In FIG. 4, since the enlargement or reduction percentage is 100% (the original polygon and the enlarged or reduced polygon are of the same size), the number of original polygons present between the area I and the area III is 1 (100% divided by 100%).

Figure 5:
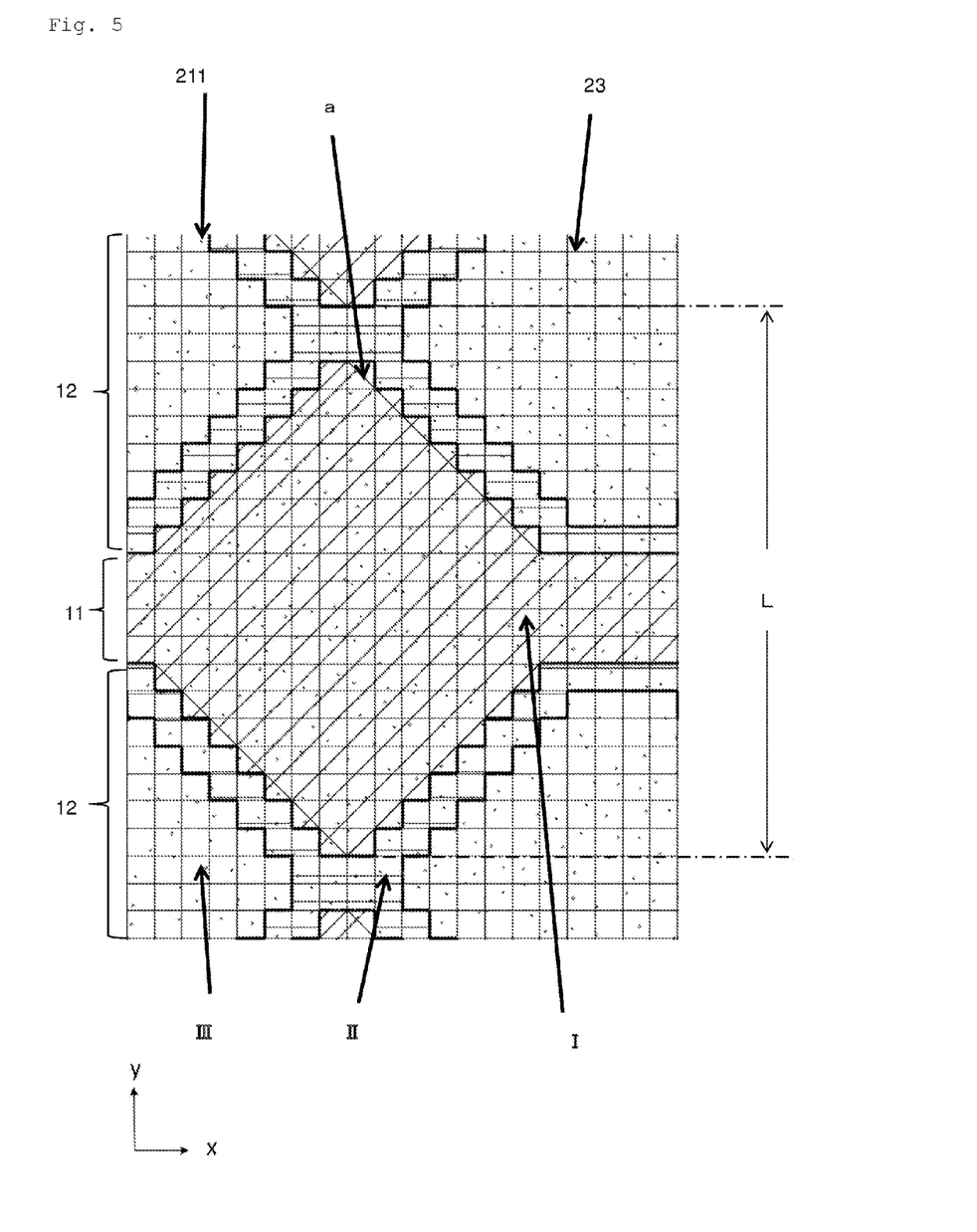
FIG. 5 is a schematic view showing an example in which generators are provided to generate a Voronoi diagram in the sensor part and the dummy part.
Figure 6:
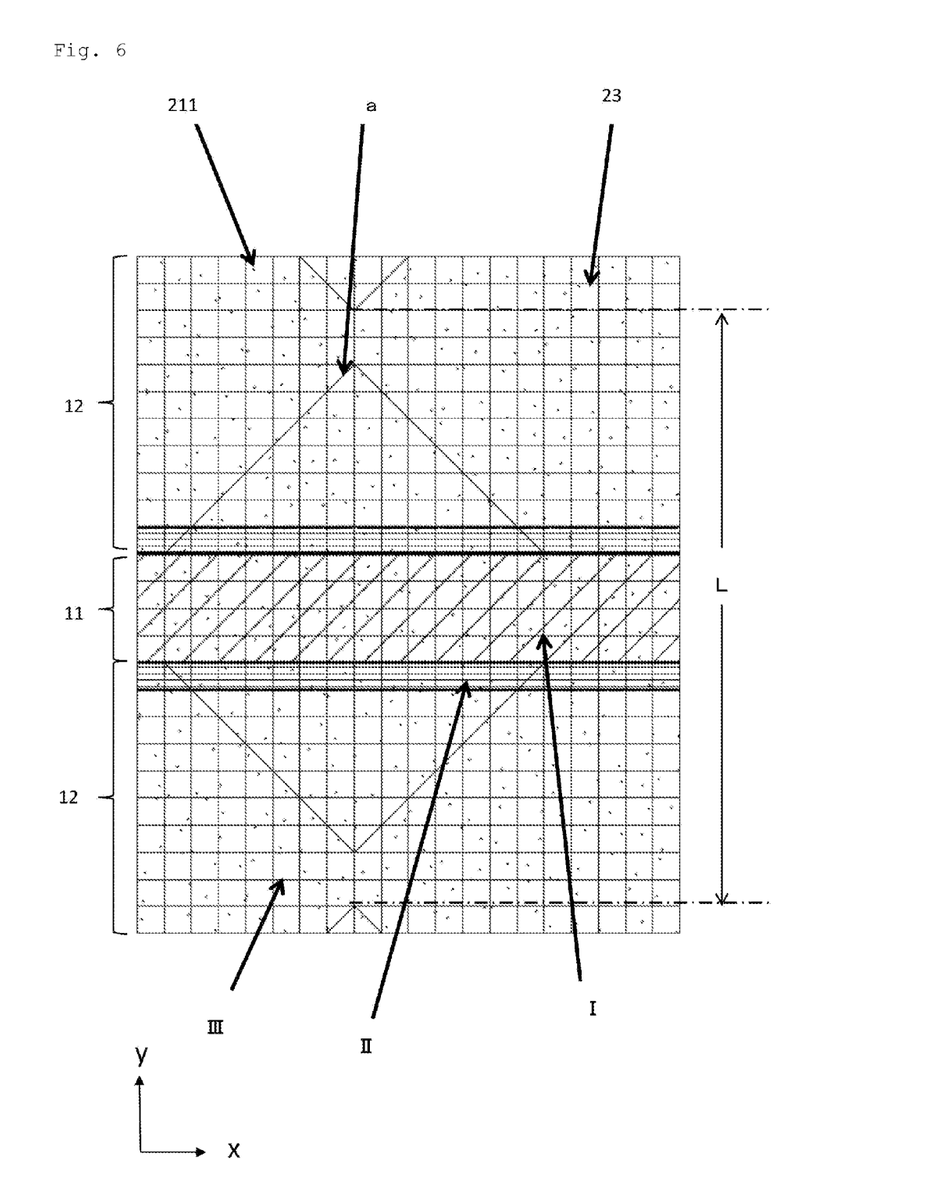
FIG. 6 is a schematic view showing an example in which generators are provided to generate a Voronoi diagram having a cycle in part of the sensor part of the present invention.
Figure 7:
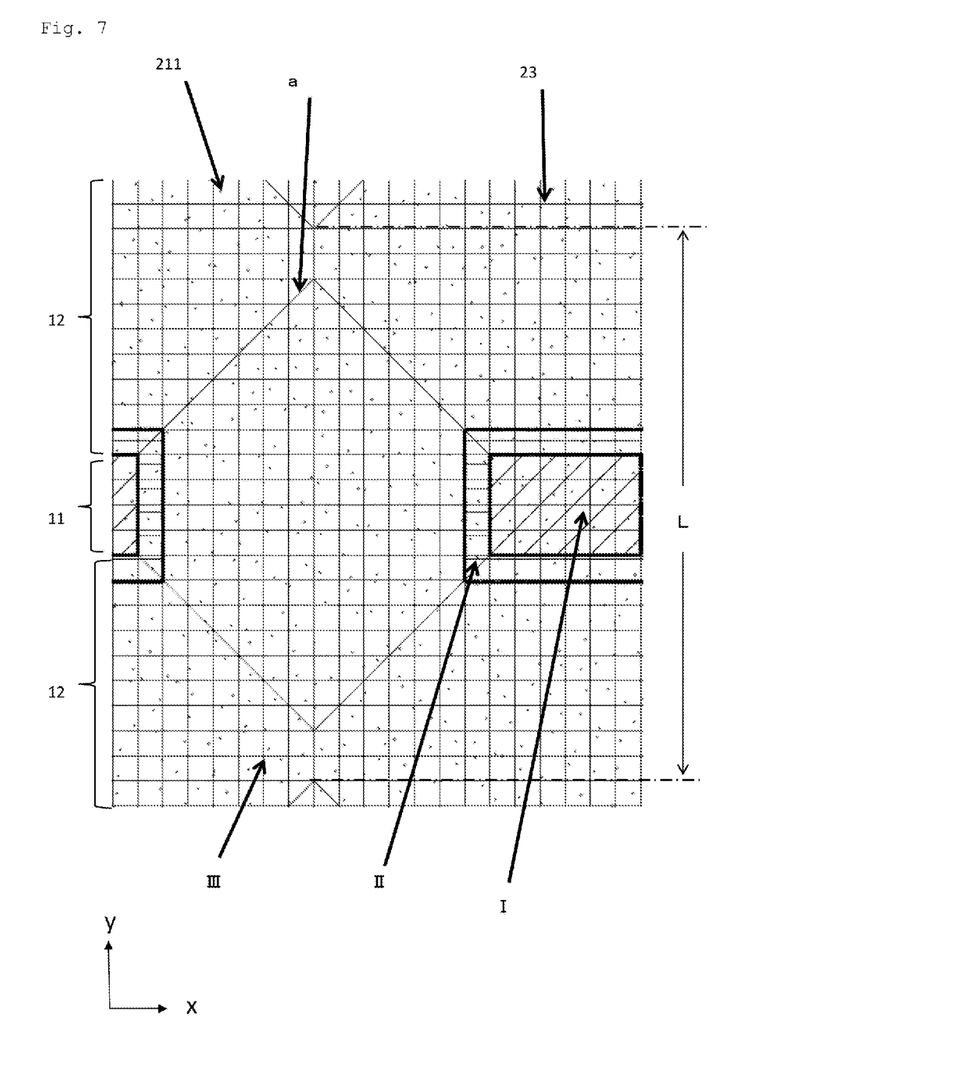
FIG. 7 is a schematic view showing another example in which generators are provided to generate a Voronoi diagram having a cycle in part of the sensor part of the present invention.

FIGS. 5 to 7 each show an example in which generators are disposed in the sensor parts and the dummy parts to generate a Voronoi diagram. In FIG. 5, the plane formed of the sensor parts 11 and the dummy parts 12 is tiled using original polygons 23, and in each original polygon 23, one generator 211 is disposed in a random manner. The sensor parts 11 and the dummy parts 12 are divided by a boundary line a (where line breaks exist, the diamond pattern in FIG. 1). The sensor parts 11 and the dummy parts 12 have a contour shape extending in the x direction (a first direction) in the figure, and are arranged at a cycle L in the y direction (a second direction). In FIG. 5, generators 211 in the area I shaded with oblique lines and the area II shaded with horizontal lines appear at a cycle of L in the y direction, but generators 211 in the area III do not have a cycle. When Voronoi edges are generated, according to the above description, from the generators in FIG. 5, Voronoi edges generated in the area I, in which the sensor parts 11 are entirely included, have a cycle of L in the y direction, and Voronoi edges generated in the area III, which is in the dummy parts 12, do not have a cycle.

In the present invention, the sensor parts are arranged at a cycle of L in the second direction, and at least part of the metal thin line pattern in the sensor parts, preferably at least 5%, more preferably at least 10% of the total area of the sensor parts has a cycle of 2L/N in the second direction (wherein N is any natural number). Particularly preferred as the part having the cycle of 2L/N (wherein N is any natural number) of the metal thin line pattern in the sensor part is, in the cases where the contour shape of the sensor part is narrowed at a cycle of M in the x direction (the diamond pattern shown in FIG. 1), the narrowest part of the sensor part as shown in FIG. 6 and FIG. 7 (the area I in FIG. 7), for example. The part narrowest in the y direction (in the second direction) perpendicular to the x direction (the first direction) in which the sensor part 11 extends, as shown in FIG. 6 and FIG. 7, most significantly influences the sensor performance (resistance values, reliability, etc.). Therefore, it is preferable that the metal thin line pattern has a cycle of 2L/N in the second (or y) direction (wherein N is any natural number) in such a part (even the area ratio to the entire sensor part is small), and it is more preferable that, in 80% or more of the area of the part, the metal thin line pattern has a cycle of 2L/N in the second (or y) direction (wherein N is any natural number). Meanwhile, it is necessary that the metal thin line pattern in the dummy part 12 has a cycle longer than 2L/N or does not have a cycle in the second direction. However, as shown in FIGS. 5 to 7, the area II, which may or may not have a cycle, exists in the dummy part, and therefore, the above requirement does not apply to the entire dummy part. Preferably 20% or less, and more preferably 10% or less of the entire area of the dummy part may have a cycle of 2L/N or less in the second direction.

As described above, in the present invention, at least part of the metal thin line pattern in the sensor parts has a cycle of 2L/N in the second direction (wherein N is any natural number), i.e., the direction in which a plurality of sensor parts are arranged. In FIGS. 5 to 7, all or part of the sensor parts has a cycle L in the y direction. In this case, since L=2L/2, the N in the above described cycle 2L/N of the metal thin line pattern in the sensor part of the present invention, in FIGS. 5 to 7, is 2, which is the most preferable value of N in the present invention. If N is too large and 2L/N is smaller than the cycle at which the original polygons appear in the second direction, it is difficult to produce a cycle in the sensor part in the second direction. For this reason, too large N is not preferable in the present invention, and the range of preferable N is 4 or less. The metal thin line pattern in the dummy parts has a cycle longer than 2L/N or does not have a cycle in the second direction, but preferably has a cycle of a certain length for achieving a uniform capacitance of the sensor part. When the metal thin line pattern in the dummy parts has a cycle of P×L (wherein P is any natural number) in the second direction, the preferred value of P is 4 to 20.

In a projected capacitive touchscreen, two sheets of patterned optically transparent conductive material joined together are used. Together with an optically transparent conductive material of which the sensor parts have a contour shape extending in the x direction at a pattern cycle of M in the same direction and are arranged at a cycle of L in the y direction, as shown in FIG. 1, an optically transparent conductive material of which the sensor parts have a contour shape extending in the y direction and are arranged at a cycle of Q in the x direction is used as a counterpart. In this case, the relation of the cycle M of the sensor parts in the x direction shown in FIG. 1 and the cycle Q is generally M=Q, and the relation is also preferred in the present invention. In the present invention, it is also preferred that at least part of the metal thin line pattern in the sensor parts has a cycle of 2M/R (wherein R is any natural number) in the first direction in which the sensor parts extend, and the dummy parts have a cycle longer than 2M/R (wherein R is any natural number) or do not have a cycle.

In the present invention, the sensor part 11 and the dummy part 12 are formed of a metal thin line pattern having a mesh shape. The metal is preferably gold, silver, copper, nickel, aluminum, and a composite material thereof. From the viewpoint of production efficiency, it is preferred that the peripheral wire part 14 and the terminal part 15 also have a metal thin line pattern made of a metal having the same composition as that of the sensor part 11 and the dummy part 12. As the method for forming the metal thin line patterns, publicly known methods can be used, and the examples thereof include a method in which a silver halide photosensitive material is used; a method in which, after a silver image is obtained by the aforementioned method, electroless plating or electrolytic plating of the silver image is performed; a method in which screen printing with use of a conductive ink, such as a silver paste and a copper paste, is performed; a method in which inkjet printing with use of a conductive ink, such as a silver ink and a copper ink, is performed; a method in which the metal pattern is obtained by forming a conductive layer by evaporation coating or sputtering, forming a resist film thereon, exposing, developing, etching, and removing the resist layer; and a method in which a metal pattern is obtained by placing a metal foil, such as a copper foil, forming a resist film thereon, exposing, developing, etching, and removing the resist layer. Among them, the silver halide diffusion transfer process (one kind of methods using silver halide photosensitive materials) is preferably used for easily forming an extremely microscopic metal thin line pattern and for allowing reduction in the thickness of the metal thin line pattern to be produced. The silver halide diffusion transfer process is described in, for example, JP 2003-077350 A and JP 2008-251274 A.

If the metal thin line pattern produced by the above-mentioned method is too thick, the subsequent processes (for example, adhesion to another member etc.) may become difficult to carry out, and if the metal thin line pattern is too thin, the conductivity required of touchscreens can hardly be achieved. Therefore, the thickness is preferably 0.01 to 5 µm, and more preferably 0.05 to 1 µm. The line width of the metal thin line pattern in the sensor parts 11 and the dummy parts 12 is preferably 1 to 20 µm, more preferably 2 to 7 µm for achieving both conductivity and optical transparency.

In order to prevent short circuit in the optically transparent conductive material of the present invention, it is necessary to provide a non-image part, of which the width has no limitation, on the boundary between the sensor part and the dummy part or inside the dummy part, and the non-image part can be obtained by providing the metal thin line pattern with line breaks. The position of such a line break may be, in the cases where the metal thin line pattern is a Voronoi pattern, on the boundary line between the sensor part and the dummy part depending on the shape of the sensor part, or in the dummy part, i.e., at an intersection of a Voronoi edge and a line connecting points at a certain distance from the boundary with the sensor part, the midpoint of a Voronoi edge or an intersection of Voronoi edges, a specific point on a Voronoi edge, the intersection of a Voronoi edge and a Delaunay line connecting generators for generating a Voronoi edge, or at a random position. The length of the line break is preferably 1 to 50 µm, and more preferably 3 to 15 µm. It is also preferred to provide line breaks perpendicular to Voronoi edges.

In the optically transparent conductive material of the present invention, the total light transmittance of the sensor parts 11 and the dummy parts 12 is preferably 80% or higher, and more preferably 85% or higher. The difference in the total light transmittance between the sensor parts 11 and the dummy parts 12 is preferably within 0.5%, more preferably within 0.1%, and further more preferred is that the total light transmittance of the sensor parts 11 is equal to that of the dummy parts 12. The sensor parts 11 and the dummy parts 12 each preferably have a haze value of 2 or less. Also, regarding the color phase of the sensor parts 11 and the dummy parts 12, the b* value in the CIELAB color space is preferably 2 or less, and more preferably 1 or less.

As the optically transparent support of the optically transparent conductive material, a publicly known support which has optical transparency and which is made of, for example, glass, a polyester resin such as polyethylene terephthalate (PET) or polyethylene naphthalate (PEN), an acrylate resin, an epoxy resin, a fluororesin, a silicone resin, a polycarbonate resin, a diacetate resin, a triacetate resin, a polyarylate resin, polyvinyl chloride, a polysulfone resin, a polyether sulfone resin, a polyimide resin, a polyamide resin, a polyolefine resin, a cyclic polyolefin resin, or the like is preferably used. Here, "optically transparent" means that the total light transmittance is 60% or higher, and the total light transmittance is preferably 80% or higher. The thickness of the optically transparent support is preferably 50 µm to 5 mm. Also, the optically transparent support may be provided with a publicly known layer, such as an antifingerprint layer, a hard coat layer, an antireflection layer, and an antiglare layer.

The optically transparent conductive material of the present invention may be provided with a publicly known layer, such as a hard coat layer, an antireflection layer, an adhesive layer, and an antiglare layer at any location. Also, between the optically transparent support and the optically transparent conductive layer having the sensor part 11, the dummy part 12, etc., a publicly known layer, such as a physical development nuclei layer, an easily adhering layer, and an adhesive layer may be provided.

Examples

Hereinafter, the present invention will be illustrated in more detail by Examples, but the present invention is not limited thereto and can be embodied in various ways within the scope of the invention.
<Optically Transparent Conductive Material 1>

As an optically transparent support, a 100-μm-thick polyethylene terephthalate film was used. The total light transmittance of this optically transparent support was 91%.

Next, in accordance with the following formulation, a physical development nuclei coating liquid was prepared, applied onto the optically transparent support, and dried to provide a physical development nuclei layer.

| <Preparation of palladium sulfide sol> | | |
|---|---|---|
| Liquid A | Palladium chloride | 5 g |
| | Hydrochloric acid | 40 mL |
| | Distilled water | 1000 mL |
| Liquid B | Sodium sulfide | 8.6 g |
| | Distilled water | 1000 mL |

Liquid A and Liquid B were mixed with stirring, and after 30 minutes, passed through a column filled up with an ion exchange resin to give a palladium sulfide sol.

| <Preparation of physical development nuclei coating liquid> per m² of silver halide photosensitive material | |
|---|---|
| The above-prepared palladium sulfide sol | 0.4 mg |
| 2 mass % glyoxal aqueous solution | 0.2 mL |
| Surfactant (S-1) | 4 mg |
| Denacol EX-830 (Polyethylene glycol diglycidyl ether made by Nagase Chemtex Corp.) | 50 mg |
| 10 mass % SP-200 aqueous solution (Polyethyleneimine made by Nippon Shokubai Co., Ltd.; average molecular weight; 10,000) | 0.5 mg |

Subsequently, an intermediate layer, a silver halide emulsion layer, and a protective layer, of which the compositions are shown below, were applied in this order (from closest to the optically transparent support) onto the above physical development nuclei layer, and dried to give a silver halide photosensitive material. The silver halide emulsion was produced by a general double jet mixing method for photographic silver halide emulsions. The silver halide emulsion was prepared using 95 mol % of silver chloride and 5 mol % of silver bromide so as to have an average particle diameter of 0.15 μm. The obtained silver halide emulsion was subjected to gold and sulfur sensitization using sodium thiosulfate and chloroauric acid by the usual method. The silver halide emulsion obtained in this way contained 0.5 g of gelatin per gram of silver.

| <Composition of intermediate layer> per m² of silver halide photosensitive material | |
|---|---|
| Gelatin | 0.5 g |
| Surfactant (S-1) | 5 mg |
| Dye 1 | 50 mg |

| <Composition of silver halide emulsion layer> per m² of silver halide photosensitive material | |
|---|---|
| Gelatin | 0.5 g |
| Silver halide emulsion | Equivalent of 3.0 g of silver |
| 1-Phenyl-5-mercaptotetrazole | 3 mg |
| Surfactant (S-1) | 20 mg |

| <Composition of protective layer> per m² of silver halide photosensitive material | |
|---|---|
| Gelatin | 1 g |
| Amorphous silica matting agent (average particle diameter: 3.5 μm) | 10 mg |
| Surfactant (S-1) | 10 mg |

Figure 8:
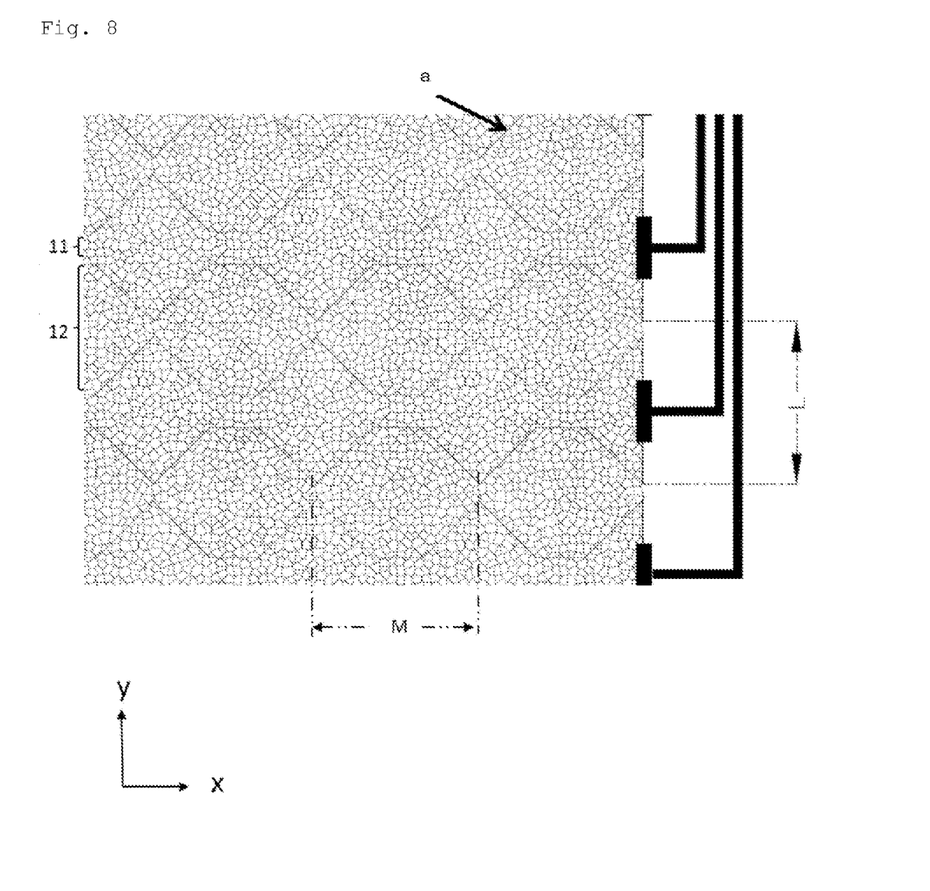
FIG. 8 is an enlarged view of a part of a transparent manuscript used in the Examples.

The silver halide photosensitive material obtained as above was brought into close contact with a transparent manuscript having the pattern image shown in FIG. 1, and exposure was performed, through a resin filter which cuts off light of 400 nm or less, using a contact printer having a mercury lamp as a light source. In the transparent manuscript, the cycle L of the sensor parts 11 and the cycle M of the narrowed parts of the diamond pattern of the sensor parts 11 are both 2.7 mm. FIG. 8 is an enlarged view of a part of the transparent manuscript used in the Examples, where the sensor part 11 and the dummy part 12 of FIG. 1 are enlarged.

In the transparent manuscript having the pattern of FIG. 1 and FIG. 8, the metal thin line pattern in the sensor part 11 and the dummy part 12 is formed by repetition of the Voronoi pattern generated from generators shown in FIG. 5. In FIG. 5, a square of which the length of a side in the x direction is 0.27 mm and the length of a side in the y direction is 0.27 mm is used as an original polygon, and this original polygon is repeatedly arranged in the x direction and the y-direction to tile the plane. For each original polygon, points at 100% of the distance from the gravity center to each vertex are connected to form another polygon (in this case, this polygon is the same as the original polygon:enlargement/reduction ratio is 100%), and in each newly-formed polygon, a generator is randomly disposed. The plane is divided by boundary lines in such a manner that a region closest to a generator is separated from other regions each closest to a different generator, and thus the Voronoi pattern is produced. The line width in the Voronoi pattern is 4 μm. In FIG. 8, at the intersection of a boundary line a and a Voronoi edge, a line break 5 μm in length is provided. Also, at the intersection of the Voronoi edge and a Delaunay line connecting generators (not shown) disposed in original polygons adjacent (on the side of the dummy part 12) to each original polygon (not shown) on the boundary line a, a line break 5 μm in length is provided. In addition, at the intersection of a Delaunay line connecting generators (not shown) disposed in the second original polygons (on the side of the dummy part 12 and not in the region of sensor part 11) from each original polygon on the boundary line a and the Voronoi edge, a line break 5 μm in length is provided. The thin line pattern in the sensor parts 11 has a cycle of 2.7 mm in the x direction and a cycle of 2.7 mm in the y direction, and the thin line pattern in the dummy parts 12 has a cycle of 21.6 mm in the x direction and a cycle of 21.6 mm in the y direction.

After immersion in the diffusion transfer developer having the composition shown below at 20° C. for 60 seconds, the silver halide emulsion layer, the intermediate layer, and the protective layer were washed off with warm water at 40° C., and a drying process was performed. By repeating this process 100 times, 100 sheets of the optically transparent conductive material 1 having a metal silver image of the pattern of FIG. 1 as an optically transparent conductive layer were obtained. The metal silver image of the optically transparent conductive layer of the obtained optically transparent conductive material had the same shape and line width as those of the image of the transparent manuscript having the pattern of FIG. 1 and FIG. 8. The film thickness of the metal silver image measured with a confocal microscope was 0.2 m. The total light transmittance of the sensor part and that of the dummy part were both 89.6%.

| <Composition of diffusion transfer developer> | |
|---|---|
| Potassium hydroxide | 25 g |
| Hydroquinone | 18 g |
| 1-Phenyl-3-pyrazolidone | 2 g |
| Potassium sulfite | 80 g |
| N-methylethanolamine | 15 g |
| Potassium bromide | 1.2 g |

Water was added to the above ingredients to make the total volume of 1000 mL, and the pH was adjusted to 12.2.

<Optically Transparent Conductive Material 2>

The same procedure was performed as in the preparation for the optically transparent conductive material 1 using a transparent manuscript having the pattern of FIG. 1, in which the thin line pattern in the sensor parts 11 has a cycle of 2.7 mm in the x direction and a cycle of 2.7 mm in the y direction, the thin line pattern in the dummy parts 12 has a cycle neither in the x direction or in the y direction, and other conditions are the same as those of the transparent manuscript used in the preparation for the optically transparent conductive material 1. Thus, 100 sheets of the optically transparent conductive material 2 were obtained.

<Optically Transparent Conductive Material 3>

The same procedure was performed as in the preparation for the optically transparent conductive material 1 using a transparent manuscript having the pattern of FIG. 1, in which the thin line pattern in the sensor parts 11 has a cycle of 2.7 mm in the x direction and a cycle of 2.7 mm in the y direction, the thin line pattern in the dummy parts 12 has a cycle of 2.7 mm in the x direction and a cycle of 2.7 mm in the y direction, and other conditions are the same as those of the transparent manuscript used in the preparation for the optically transparent conductive material 1. Thus, 100 sheets of the optically transparent conductive material 3 were obtained.

<Optically Transparent Conductive Material 4>

The same procedure was performed as in the preparation for the optically transparent conductive material 1 using a transparent manuscript having the pattern of FIG. 1, in which the thin line pattern in the sensor parts 11 has a cycle of 21.6 mm in the x direction and a cycle of 21.6 mm in the y direction, the thin line pattern in the dummy parts 12 has a cycle of 21.6 mm in the x direction and a cycle of 21.6 mm in the y direction, and other conditions are the same as those of the transparent manuscript used in the preparation for the optically transparent conductive material 1. Thus, 100 sheets of the optically transparent conductive material 4 were obtained.

<Optically Transparent Conductive Material 5>

The same procedure was performed as in the preparation for the optically transparent conductive material 1 using a transparent manuscript having the pattern of FIG. 1, in which the thin line pattern in the sensor parts 11 has a cycle of 2.7 mm in the x direction and a cycle of 2.7 mm in the y direction, the thin line pattern in the dummy parts 12 has a cycle of 4.05 mm in the x direction and a cycle of 4.05 mm in the y direction, and other conditions are the same as those of the transparent manuscript used in the preparation for the optically transparent conductive material 1. Thus, 100 sheets of the optically transparent conductive material 5 were obtained.

<Optically Transparent Conductive Material 6>

The same procedure was performed as in the preparation for the optically transparent conductive material 1 using a transparent manuscript having the pattern of FIG. 1, in which neither the thin line pattern in the sensor part 11 nor the thin line pattern in the dummy part 12 has any cycle and other conditions are the same as those of the transparent manuscript used in the preparation for the optically transparent conductive material 1. Thus, 100 sheets of the optically transparent conductive material 6 were obtained.

<Optically Transparent Conductive Material 7>

The same procedure was performed as in the preparation for the optically transparent conductive material 1 using a transparent manuscript having the pattern of FIG. 1, in which the thin line pattern in the sensor parts 11 has a cycle of 1.8 mm in the x direction and a cycle of 1.8 mm in the y direction, the thin line pattern in the dummy parts 12 has a cycle of 21.6 mm in the x direction and a cycle of 21.6 mm in the y direction, and other conditions are the same as those of the transparent manuscript used in the preparation for the optically transparent conductive material 1. Thus, 100 sheets of the optically transparent conductive material 7 were obtained.

<Optically Transparent Conductive Material 8>

The same procedure was performed as in the preparation for the optically transparent conductive material 1 using a transparent manuscript having the pattern of FIG. 1, in which the thin line pattern in the sensor parts 11 has a cycle of 1.08 mm in the x direction and a cycle of 1.08 mm in the y direction, the thin line pattern in the dummy parts 12 has a cycle of 21.6 mm in the x direction and a cycle of 21.6 mm in the y direction, and other conditions are the same as those of the transparent manuscript used in the preparation for the optically transparent conductive material 1. Thus, 100 sheets of the optically transparent conductive material 8 were obtained.

<Optically Transparent Conductive Material 9>

The same procedure was performed as in the preparation for the optically transparent conductive material 1 using a transparent manuscript having the pattern of FIG. 1, in which the thin line pattern is formed of Voronoi edges generated from generators having a cycle shown in FIG. 6 and other conditions (the thin line width, the cycle of the original polygon, the enlargement/reduction ratio of the enlarged or reduced polygon, etc.) are the same as those of the transparent manuscript used in the preparation for the optically transparent conductive material 1. Thus, 100 sheets of the optically transparent conductive material 9 were obtained. The thin line pattern generated from the generators belonging to the area I in the sensor parts 11 has a cycle of 2.7 mm in the x direction and a cycle of 2.7 mm in the y direction, and the other thin line pattern has a cycle of 21.6 mm in the x direction and a cycle of 21.6 mm in the y direction.

<Optically Transparent Conductive Material 10>

The same procedure was performed as in the preparation for the optically transparent conductive material 1 using a transparent manuscript having the pattern of FIG. 1, in which the thin line pattern is formed of Voronoi edges generated from generators having a cycle shown in FIG. 7 and other conditions (the thin line width, the size of the original polygon, the enlargement/reduction ratio of the enlarged or reduced polygon, etc.) are the same as those of the transparent manuscript used in the preparation for the optically transparent conductive material 1. Thus, 100 sheets of the optically transparent conductive material 10 were obtained. The thin line pattern generated from the generators belonging to the area I in the sensor parts 11 has a cycle of 2.7 mm in the x direction and a cycle of 2.7 mm in the y direction, and the other thin line pattern has a cycle of 21.6 mm in the x direction and a cycle of 21.6 mm in the y direction.

<Optically Transparent Conductive Material 11>

Figure 9:
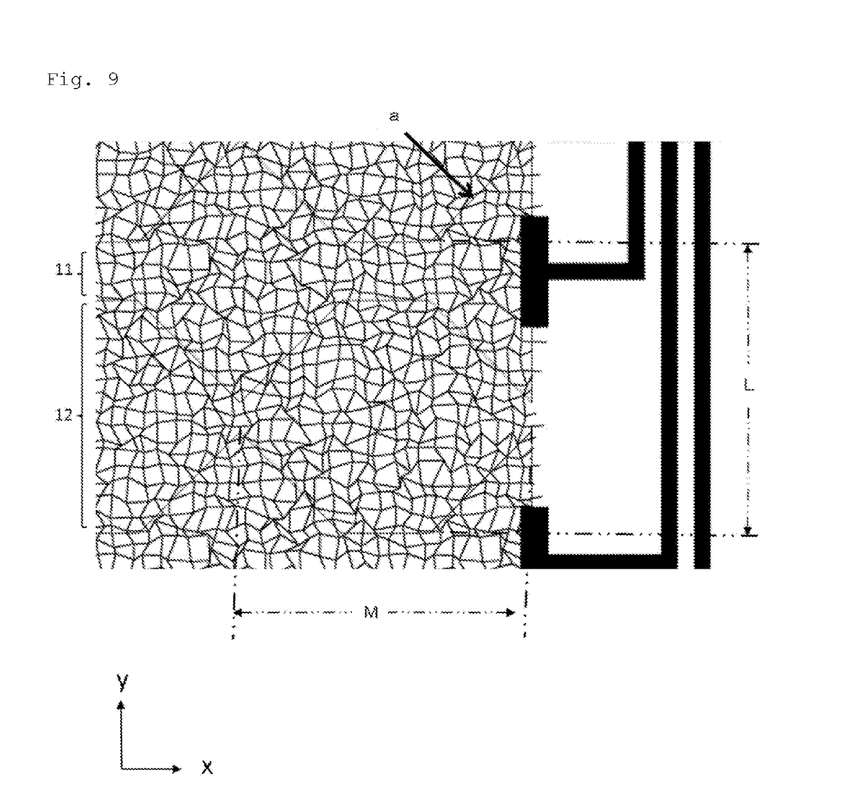
FIG. 9 is an enlarged view of a part of another transparent manuscript used in the Examples.

The same procedure was performed as in the preparation for the optically transparent conductive material 1 using a transparent manuscript having the pattern of FIG. 1, in which the thin line pattern in the sensor parts 11 and the thin line pattern in the dummy parts 12 have the pattern of the type shown in FIG. 9 using Delaunay lines connecting generators at the same positions as those in FIG. 5 and other conditions are the same as those of the transparent manuscript used in the preparation for the optically transparent conductive material 1. Thus, 100 sheets of the optically transparent conductive material 11 were obtained. The thin line pattern in the sensor parts 11 has a cycle of 2.7 mm in the x direction and a cycle of 2.7 mm in the y direction, and the thin line pattern in the dummy parts 12 has a cycle of 21.6 mm in the x direction and a cycle of 21.6 mm in the y direction.

<Optically Transparent Conductive Material 12>

The same procedure was performed as in the preparation for the optically transparent conductive material 1 using a transparent manuscript having the pattern of FIG. 1, in which the thin line pattern in the sensor parts 11 and the thin line pattern in the dummy parts 12 have the pattern using Delaunay lines connecting the generators used for generating Voronoi edges of the optically transparent conductive material 3 and other conditions are the same as those of the transparent manuscript used in the preparation for the optically transparent conductive material 1. Thus, 100 sheets of the optically transparent conductive material 12 were obtained. The thin line pattern in the sensor parts 11 has a cycle of 2.7 mm in the x direction and a cycle of 2.7 mm in the y direction, and the thin line pattern in the dummy parts 12 has a cycle of 2.7 mm in the x direction and a cycle of 2.7 mm in the y direction.

The obtained optically transparent conductive materials 1 to 12 were evaluated in terms of the continuity of the circuit as an index of the reliability and in terms of the appearance (transparency, reflection) as an index of moire and conspicuousness.

<Reliability>

In the pattern of FIG. 1, there are 10 sets of circuits each connecting the terminal part 15, the peripheral wire unit 14, the sensor part 11, the peripheral wire unit 14, and the terminal part 15 in this order. All of the 100 sheets each of the optically transparent conductive materials 1 to 12 obtained as above were evaluated as follows. The continuity of the circuit designed to be electrically connected was checked for all of the 10 sets of circuits using a multitester. In addition, the presence or absence of short circuit was examined between every pair in the 10 sets. The percentage of non-defective sheets, in which the continuity was confirmed for all of the 10 sets of circuits and there was no short circuit therebetween, relative to 100 sheets of each optically transparent conductive material was shown in FIG. 1.

<Appearance: Transparency>

Each of the obtained optically transparent conductive materials 1 to 12 was placed on the screen of a 23" wide LCD monitor (Flatron23EN43V-B2 made by LG Electronics) displaying solid white, and was evaluated as follows. The level at which moire or grains was obvious was defined as "C", the level at which moire or grains was noticeable as a result of close inspection was defined as "B", and the level at which moire or grains was unnoticeable was defined as "A".

<Appearance: Reflection>

Each of the optically transparent conductive materials 1 to 12 obtained as above was placed on a black board in a dark room enclosed by a blackout curtain, irradiated from above by a three-band fluorescent lamp, and observed from an oblique direction. The level at which the geometric pattern of the sensor part 11 and/or the dummy part 12 was obvious was evaluated as "C", the level at which the geometric pattern was noticeable was evaluated as "B", and the level at which the geometric pattern was unnoticeable was evaluated as "A". The results are shown in Table 1.

TABLE 1

|  | Reliability | Appearance (transparency) | Appearance (reflection) | Note |
| --- | --- | --- | --- | --- |
| Optically transparent conductive material 1 | 100% | A | A | Present invention |

TABLE 1-continued

| | Reliability | Appearance (transparency) | Appearance (reflection) | Note |
|---|---|---|---|---|
| Optically transparent conductive material 2 | 100% | A | B | Present invention |
| Optically transparent conductive material 3 | 100% | A | C | Comparative Example |
| Optically transparent conductive material 4 | 50% | B | B | Comparative Example |
| Optically transparent conductive material 5 | 100% | A | B | Present invention |
| Optically transparent conductive material 6 | 40% | B | B | Comparative Example |
| Optically transparent conductive material 7 | 100% | A | A | Present invention |
| Optically transparent conductive material 8 | 100% | A | B | Present invention |
| Optically transparent conductive material 9 | 100% | A | A | Present inventation |
| Optically transparent conductive material 10 | 100% | A | A | Present invention |
| Optically transparent conductive material 11 | 90% | B | A | Present invention |
| Optically transparent conductive material 12 | 90% | B | C | Comparative Example |

The results in FIG. 1 show that the present invention provides an optically transparent conductive material which does not cause moire and has a favorably low conspicuousness and a high reliability.

REFERENCE SIGNS LIST

1 Optically transparent conductive material
2 Optically transparent support
11 Sensor part
12 Dummy part
13 Non-image part
14 Peripheral wire part
15 Terminal part
20 Plane
21 Region
22 Boundary line
23 Original polygon
24 Gravity center
25 Reduced polygon
26 Voronoi edge
31 Enlarged side
211 Generator
a Boundary line
L, M Cycle
I, II, III Area

The invention claimed is:

1. An optically transparent conductive material having, on an optically transparent support, an optically transparent conductive layer having optically transparent sensor parts electrically connected to terminal parts and optically transparent dummy parts not electrically connected to terminal parts, wherein the sensor parts and the dummy parts are formed of a metal thin line pattern having a mesh shape, and in the plane of the optically transparent conductive layer, the contour shape of each of the sensor parts extends in a first direction, the dummy parts are arranged alternately with the sensor parts in a second direction perpendicular to the first direction, the sensor parts are arranged at a cycle of L in the second direction, at least part of the metal thin line pattern in the sensor parts has a cycle of 2L/N in the second direction (wherein N is any natural number), and the metal thin line pattern in the dummy parts has a cycle longer than 2L/N or does not have a cycle in the second direction.

2. The optically transparent conductive material of claim 1, wherein the metal thin line pattern in the sensor part and the dummy part is a Voronoi pattern.

3. The optically transparent conductive material of claim 1, wherein N is 4 or less.

4. The optically transparent conductive material of claim 1, wherein the metal thin line pattern in the dummy parts has a cycle of P×L (wherein P is a natural number of 4 to 20) in the second direction.

* * * * *

UNITED STATES PATENT AND TRADEMARK OFFICE
CERTIFICATE OF CORRECTION

PATENT NO.         : 9,836,176 B1
APPLICATION NO.    : 15/533416
DATED              : December 5, 2017
INVENTOR(S)        : Takenobu Yoshiki et al.

Page 1 of 1

It is certified that error appears in the above-identified patent and that said Letters Patent is hereby corrected as shown below:

On the Title Page

(65) PRIOR PUBLICATION DATA:
Insert:
--(65) Prior Publication Data
    US 2017/0344151 A1 Nov. 30, 2017--.

(56) REFERENCES CITED:
Foreign Patent Documents, "TW 201314525" should read --TW 2013/14525--.

In the Specification

Column 1:
Line 22, "their" should be deleted.

Column 4:
Line 34, "are for illustrating" should read --illustrate--.

Column 5:
Line 24, "of each" should read --, in each--.

Column 9:
Line 28, "patterened" should read --patterned--.

Column 14:
Line 1, "or in" should read --nor in--.

Column 16:
Line 26, "All of" should read --Throughout all of-- and "sheets" should read --sheets,--.

Signed and Sealed this
Twentieth Day of March, 2018

Andrei Iancu
*Director of the United States Patent and Trademark Office*